United States Patent
Schunemann et al.

(10) Patent No.: US 12,084,791 B2
(45) Date of Patent: Sep. 10, 2024

(54) METHOD OF PRODUCING LARGE EMI SHIELDED GAAS AND GAP INFRARED WINDOWS

(71) Applicant: BAE SYSTEMS Information and Electronic Systems Integration Inc., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 54 days.

(21) Appl. No.: 18/073,183

(22) Filed: Dec. 1, 2022

(65) Prior Publication Data

US 2024/0183075 A1 Jun. 6, 2024

(51) Int. Cl.
| | |
|---|---|
| *C30B 29/42* | (2006.01) |
| *C23C 16/30* | (2006.01) |
| *C30B 29/44* | (2006.01) |
| *C30B 33/06* | (2006.01) |

(52) U.S. Cl.
CPC .............. *C30B 33/06* (2013.01); *C23C 16/30* (2013.01); *C30B 29/42* (2013.01); *C30B 29/44* (2013.01); *Y10T 428/162* (2015.01)

(58) Field of Classification Search
None
See application file for complete search history.

(56) References Cited

U.S. PATENT DOCUMENTS

| | | |
|---|---|---|
| 4,778,731 A | 10/1988 | Kraatz |
| 4,939,043 A | 7/1990 | Biricik |
| 5,173,443 A | 12/1992 | Biricik |
| 5,824,418 A | 10/1998 | Tully |
| 10,156,023 B2 | 12/2018 | Schunemann |

OTHER PUBLICATIONS

Sotoodeh, M., A. H. Khalid, and A. A. Rezazadeh. "Empirical low-field mobility model for III-V compounds applicable in device simulation codes." Journal of applied physics 87.6 dated Mar. 15, 2000): 2890-2900.

(Continued)

*Primary Examiner* — Alexander S Thomas
(74) *Attorney, Agent, or Firm* — Maine Cernota & Curran; Gary McFaline

(57) ABSTRACT

A method of making GaP window slabs having largest dimensions of greater than 4 inches and GaAs IR window slabs having largest dimensions of greater than 8 inches, includes slicing and dicing at least one smaller GaAs or GaP single crystal boule, which can be a commercial boule, to form a plurality of rectangular slabs. The slabs are ground to have precisely perpendicular edges, which are polished to be ultra-flat and ultra-smooth, for example to a flatness of at least $\lambda/10$, and a roughness Ra of less than 10 nanometers. The slab edges are then aligned and fused via optical-contacting/bonding to create a large GaAs or GaP slab having negligible bond interface losses. A conductive, doped GaAs or GaP layer can be applied to the window for EMI shielding in a subsequent vacuum deposition step, followed by applying anti-reflection (AR) coatings to one or both of the slab faces.

20 Claims, 7 Drawing Sheets

(56) References Cited

OTHER PUBLICATIONS

Stromberg, A., Bhargava, P., Xu, Z., Lourdudoss, S. and Sun, Y. (2021), Direct Heteroepitaxy and Selective Area Growth of GaP and GaAs on Si by Hydride Vapor Phase Epitaxy. Phys. Status Solidi A, dated Oct. 17, 2020 218.3.
Jeremy B. Reeves et al., Method of Optimizing the Emi Shielding and Infrared Transparency Of GaAs IR Windows, patent application, filed Dec. 1, 2022, U.S. Appl. No. 18/072,931.
Peter G. Schunemann et al., Method of Producing Large GaAs AND GaP Infrared Windows, patent application, filed Dec. 1, 2022, U.S. Appl. No. 18/073,177.
Peter G. Schunemann et al., Method of Producing Large EMI Shielded GaAs Infrared Windows, patent application, filed Dec. 1, 2022, U.S. Appl. No. 18/073,179.
Peter G. Schunemann et al., Method of Producing Large GaAs AND GaP Infrared Windows, patent application, filed Dec. 1, 2022, U.S. Appl. No. 18/073,228.

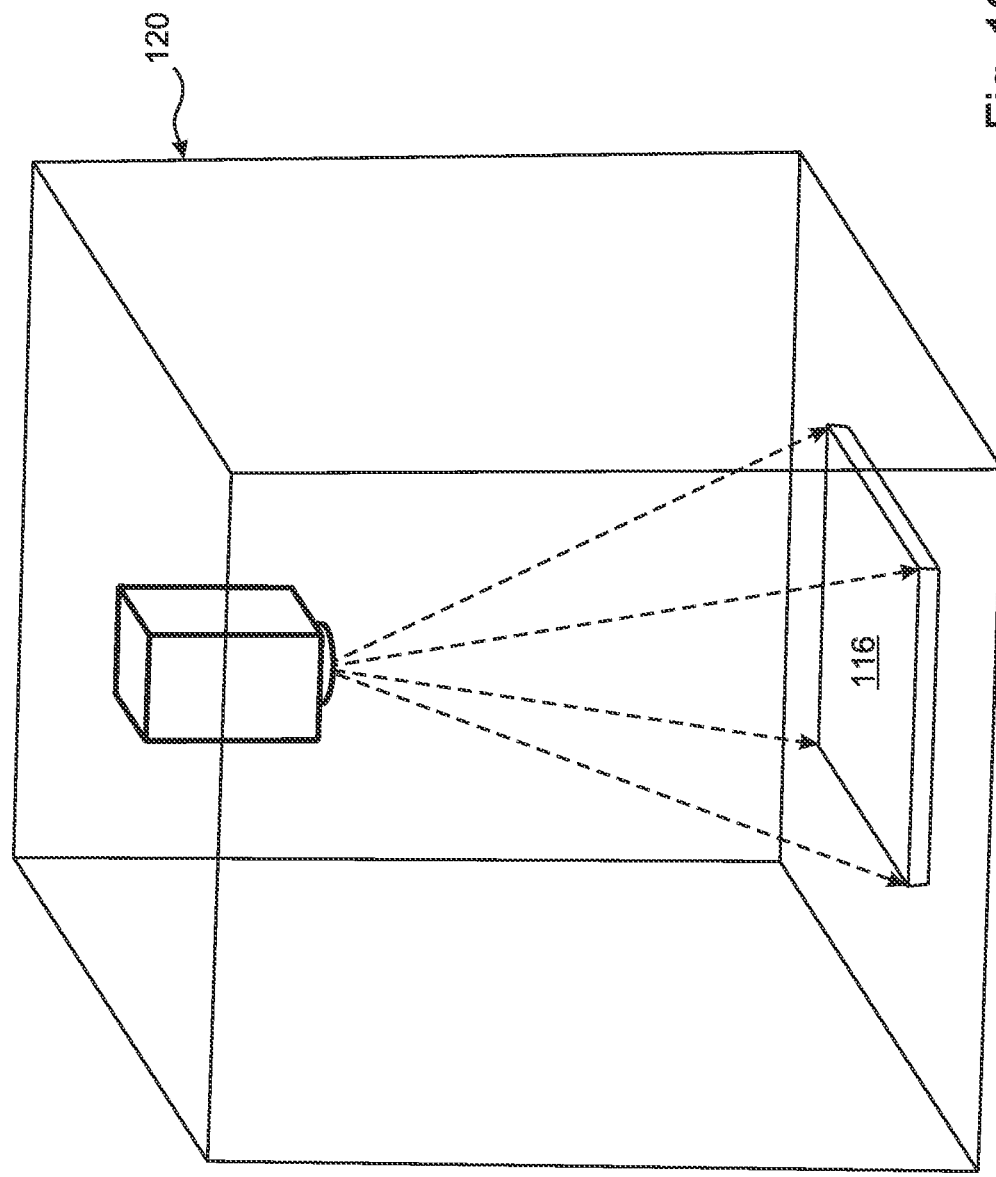

METHOD OF PRODUCING LARGE EMI SHIELDED GAAS AND GAP INFRARED WINDOWS

RELATED APPLICATIONS

This application is related to co-pending U.S. application Ser. No. 18/072,931 entitled METHOD OF OPTIMIZING THE EMI SHIELDING AND INFRARED TRANSPARENCY OF GaAs IR WINDOWS with first inventor Jeremy B. Reeves, U.S. application Ser. No. 18/073,177 entitled METHOD OF PRODUCING LARGE GaAs AND GaP INFRARED WINDOWS with first inventor Peter G. Schunemann, filed on Dec. 1, 2022, U.S. application Ser. No. 18/073,228 entitled METHOD OF PRODUCING LARGE GaAs AND GaP INFRARED WINDOWS with first inventor Peter G. Schunemann, filed on Dec. 1, 2022, and U.S. application Ser. No. 18/073,179 entitled METHOD OF PRODUCING LARGE EMI SHIELDED GaAs INFRARED WINDOWS with first inventor Peter G. Schunemann, filed on Dec. 1, 2022, all of which are also by the present Applicant, all of which are herein incorporated by reference in their entirety for all purposes.

FIELD

The disclosure relates to optical windows, and more particularly, to GaAs optical windows that are more than eight inches in diameter and GaP optical windows that are more than four inches in diameter.

BACKGROUND

A growing number of optical systems incorporate infrared (IR) sensors and/or lasers that operate over a wide range of wavelengths between one and twelve microns. Accordingly, the platforms on which these devices are mounted require optical windows that are transparent over this broad spectral range. A growing number of these applications require windows having a largest diameter of more than 8 inches, and in some cases more than 12 inches, which in turn requires that the window material must be relatively hard, so that the window will be structurally competent without being unduly thick.

Furthermore, as electronics and sensor systems become more highly and densely integrated, the need has increased for electromagnetic shielding (EMI) of components. For systems that require optical windows, it has therefore become increasingly necessary to provide EMI shielded windows, i.e. windows that have very low absorption at wavelengths of interest, while also shielding the window aperture against electromagnetic penetration.

The material that is most commonly used to manufacture large IR windows is hot-isostatic-pressed (HIP) polycrystalline Zinc Sulfide (ZnS), due to the broad spectral transparency of ZnS, because the HIP process is relatively quick, and because the window size when using this polycrystalline material is limited only by the size of the high-pressure containment vessel in which the HIP is applied. However, the mechanical properties of HIP ZnS are only adequate at best, which can sometimes limit application of the material to large IR windows, such as IR windows greater than 12 inches in diameter. Furthermore, HIP ZnS is generally produced by first growing crystalline ZnS by CVD, and then applying the additional step of HIP, which of course adds to the cost of the final product.

When EMI shielding is required, HIP ZnS windows generally rely on a metallic grid coating deposited onto a window surface. However, the metal lines in the grid coating are opaque to IR radiation, obscuring portions of the window, and can significantly reduce the optical transmission of the window, especially at large angles of incidence. Additionally, the grid pattern can lead to diffraction of IR waves passing through the material, which can have substantial negative impacts on system performance.

In many cases, to provide EMI shielding, it would be preferable to deposit a thin conducting layer of a doped semiconductor onto a surface of an IR window, as an alternative to a metallic grid. Unfortunately, is nearly impossible to dope ZnS to produce a conductive EMI layer, due to its tendency to form compensating defects that neutralize dopants to maintain their insulating properties. This problem can be circumvented by preparing a separate, thin wafer of a doped semiconductor such as GaAs, and then attaching the wafer to the surface of an HIP ZnS window by optical bonding. However, this approach can be time consuming, difficult, and expensive.

As is discussed in more detail in co-pending application Ser. No. 18/072,931, filed on Dec. 1, 2022, which is also by the present Applicant and is incorporated herein by reference, IR windows made from gallium arsenide (GaAs) or gallium phosphate (GaP) are a potential alternative to windows made from HIP ZnS.

GaAs is highly transparent from 1.7 to 12 microns, exhibits about 3.5× higher hardness compared to HIP ZnS, and can be easily and precisely doped to control the electrical properties of thin epitaxially applied conducting layers.

Gallium phosphide, GaP, is highly transparent between 0.7 and 8.5 microns, and does not absorb strongly until nearly 11 microns. It has an even higher mechanical strength than GaAs, and substantially higher visible and near-IR transparency than GaAs, at the expense of reduced transparency at longer wavelengths. Like GaAs, GaP can also be easily and precisely doped to control the electrical properties of thin, epitaxially applied conducting layers.

Relatively small, thin wafers of GaAs and GaP have been widely used in the integrated circuit (IC) and photovoltaic (i.e. solar cell) industries. GaAs and GaP substrate wafers are cut from single crystals grown by melt techniques, primarily Czochralski (Cz) or Vertical Gradient Freeze (VGF) growth. IC's, solar cells, and other multi-layer device structures are typically then grown on these substrates by epitaxial methods such as Molecular Beam Epitaxy (MBE) or Metal Organic Vapor Phase Epitaxy (MOVPE) with precisely controlled layer thicknesses. The total device structures are limited to thicknesses of several microns, and scaling to thicknesses beyond this is precluded by the very slow growth rates achievable by these epitaxial techniques.

The Cz and VGF techniques used to produce GaAs and GaP substrates for most IC and photovoltaic applications could also be used to produce IR windows by slicing much thicker slabs (several millimeters) from the single crystal boules grown from melt.

However, commercially available boules of GaAs that are grown from melt by VGF are generally limited to eight inches in diameter or less, while commercially available Boules of GaP are generally limited to only 3 inches in diameter, and even these are not widely available. Furthermore, scaling the existing GaAs melt-growth techniques to larger diameters would be extremely challenging, for both GaAs and GaP, due to the difficulty of extracting more and more heat while controlling the interface shape and crystal quality during growth from ever increasing melt sizes. Managing the high equilibrium vapor pressure during growth—particularly for GaP—becomes problematic at larger boule diameters.

This inability to produce larger diameter boules has prevented the use of GaAs and GaP as slab materials for large IR windows, e.g. for GaP windows having a largest dimension that is greater than 4 inches, and for GaAs windows having a largest dimension that is greater than 8 inches, and up to 12 inches and more.

What is needed, therefore, is a method of making GaAs slabs having largest dimensions that are greater than 4 inches, and GaP slabs having largest dimensions that are greater than 8 inches, and preferably equal to 12 inches or more, wherein the slabs are sufficiently thick to be structurally competent when used as IR windows.

SUMMARY

The present disclosure is a method of making GaAs slabs having largest dimensions that are greater than 4 inches, and GaP slabs having largest dimensions that are greater than 8 inches, and preferably equal to 12 inches or more, wherein the slabs are sufficiently thick to be structurally competent when used as IR windows. It will be understood that the present disclosure is not limited to producing slabs shaped as disks, and that references herein to the "diameter" of a slab refer to a size of the largest dimension of the slab, unless otherwise required by context.

More specifically the present disclosure teaches slicing slabs of smaller diameter from GaAs or GaP single crystal boules, such as 6-inch GaAs boules, 8-inch GaAs boules, or 3-inch GaP boules, and then "dicing" the slabs to form even smaller rectangular parallelepiped slabs, referred to herein simply as "rectangular" slabs.

The rectangular slabs are then ground, such that they have precisely perpendicular edges, and then transformed into "precursor" slabs by polishing the surrounding sides of the rectangular slabs to be ultra-flat and ultra-smooth. Typically, the surrounding sides of the rectangular slabs will be relatively smaller in area, and will surround the largest surfaces of the rectangular slabs. In embodiments, the polished surrounding sides of the precursor slabs have a flatness of at least $\lambda/10$, and a roughness Ra of less than 10 nanometers. In various embodiments, the rectangular slabs are beveled and stacked while being ground, after which the stack is mounted on a precision jig for polishing to form a stack of the precursor slabs.

The precursor slabs are then aligned and fused edge-to-edge via optical-contacting/bonding techniques to create a large GaAs or GaP window having negligible bond interface losses. Finally, in embodiments the faces of the resulting GaAs or GaP window are ground to remove bevels, and polished.

In some embodiments, EMI shielded GaAs or GaP windows are produced by applying a conductive, doped GaAs or GaP layer to the window, for example in a subsequent vacuum deposition step, for example using an epitaxial method such as molecular beam epitaxy (MBE), metal-organic vapor phase epitaxy (MOVPE), metallo-organic chemical vapor deposition (MOCVD, or organo-metallic vapor phase epitaxy (OMVPE). In various embodiments, this is followed by deposition of electrical contacts and/or single or double-side anti-reflection (AR) coatings.

A first general aspect of the present disclosure is an infrared window comprising a GaP slab having a slab largest dimension that is greater than four inches or a GaAs slab having a slab largest dimension that is greater than eight inches. The slab is formed by grinding and polishing surrounding sides of a plurality of rectangular parallelepiped slabs, referred to herein as rectangular slabs, and then aligning and contacting the surrounding sides of the rectangular slabs so as to optically bond the rectangular slabs to each other, thereby forming a monolithic GaP window slab having a largest dimension that is greater than four inches, or a monolithic GaAs window slab having a largest dimension that is greater than eight inches.

In embodiments, the monolithic window slab has a largest dimension that is greater than 12 inches.

In any of the above embodiments, the surrounding sides of each of the rectangular slabs can surround largest faces of the rectangular slabs.

In any of the above embodiments, all of the rectangular slabs can have a common size and shape.

Any of the above embodiments can further include a conductive layer of doped GaAs or GaP applied to at least one face of the monolithic window slab.

Any of the above embodiments can further include an anti-reflective coating applied to at least one face of the monolithic slab.

A second general aspect of the present disclosure is a method of making a GaAs slab having a largest dimension that is greater than eight inches or a GaP slab having a largest dimension that is greater than four inches, the slab being suitable for forming a GaP infrared (IR) transparent window having a largest dimension that is greater than four inches, or a GaAs infrared (IR) transparent window having a largest dimension that is greater than eight inches. The method includes obtaining a boule of GaAs or GaP, slicing the boule to form a plurality of rectangular parallelepiped slabs, referred to herein as rectangular slabs, grinding the rectangular slabs to have precisely perpendicular edges, polishing surrounding sides of each of the rectangular slabs to a high degree of flatness and smoothness, and aligning the surrounding sides of the rectangular slabs with each other and contacting the surrounding sides together so as to optically bond the rectangular slabs to each other, thereby forming a monolithic window slab.

In embodiments, obtaining the boule includes obtaining the boule from a commercial source.

In any of the above embodiments, polishing surrounding sides of each of the rectangular slabs to a high degree of flatness and smoothness can include polishing the surrounding sides to a flatness of better than $\lambda/10$ and to a smoothness with Ra less than 10 nanometers.

Any of the above embodiments can further include grinding faces of the monolithic window slab to remove bevels.

Any of the above embodiments can further include polishing faces of the monolithic window slab.

In any of the above embodiments, the monolithic window slab can have a largest dimension that is greater than 12 inches.

In any of the above embodiments, the surrounding sides of each of the rectangular slabs can surround largest faces of the rectangular slabs.

In any of the above embodiments, all of the rectangular slabs can have a common size and shape. In some of these embodiments, grinding the rectangular slabs to have precisely perpendicular edges includes arranging the rectangular slabs in a stacked configuration, and grinding sides of the stack. In any of these embodiments, polishing surrounding sides of each of the rectangular slabs to a high degree of flatness and smoothness can include arranging the rectangular slabs in a stacked configuration, and polishing sides of the stack. And in some of these embodiments the sides of the stack are polished while the stack is mounted on a precision jig.

Any of the above embodiments can further include applying a conductive layer of doped GaAs or GaP to at least one face of the monolithic window slab. In some of these embodiments the conductive layer is applied using a vacuum deposition process.

And any of the above embodiments can include applying an anti-reflective coating to at least one face of the monolithic slab.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1G illustrates application of a conductive semiconductor layer to the monolithic slab of FIG. 1F by vacuum deposition.

DETAILED DESCRIPTION

The present disclosure is a method of making GaAs slabs having largest dimensions that are greater than 4 inches, and GaP slabs having largest dimensions that are greater than 8 inches, and preferably equal to 12 inches or more, wherein the slabs are sufficiently thick to be structurally competent when used as IR windows.

Figure 1B:
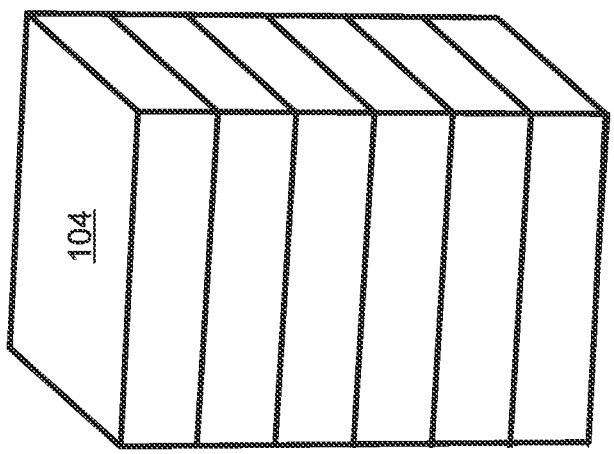
FIG. 1B is a perspective view of the stack of tiles that result from the slicing and cutting of FIG. 1A.
Figure 1A:
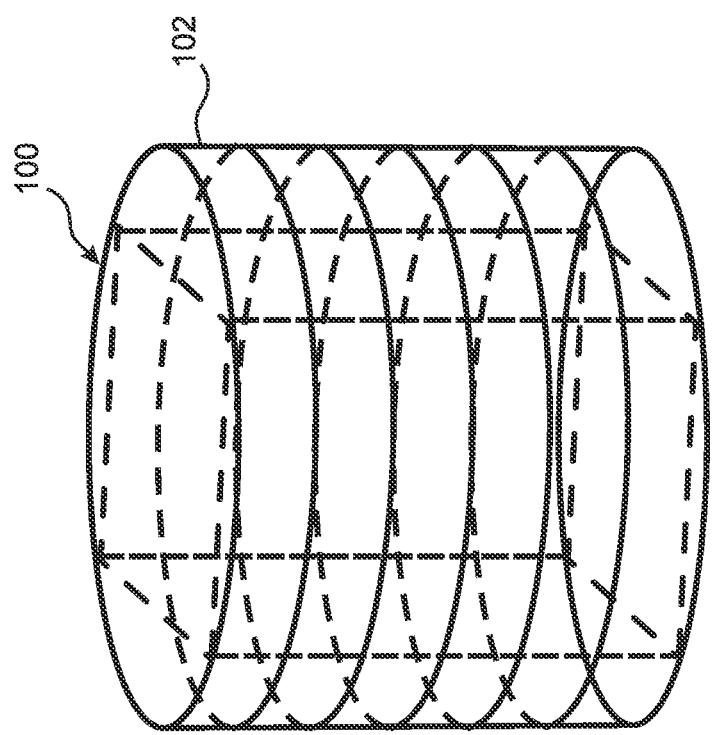
FIG. 1A is a perspective view of a boule of GaAs or GaP showing the planes along which it is sliced and cut into rectangular tiles.

With reference to FIG. 1A, the present disclosure teaches cutting slices 102 from GaAs or GaP single crystal boules 100 that are less than 12 inches in diameter, such as 6-inch GaAs boules, 8-Inch GaAs boules, or 3-inch GaP boules. In embodiments, the method includes obtaining the boules by purchasing them commercially.

With reference to FIG. 1B, the slices 102 are then "diced" to form smaller rectangular parallelepiped slabs 104, referred to herein simply as "rectangular" slabs 104.

Figure 1C:
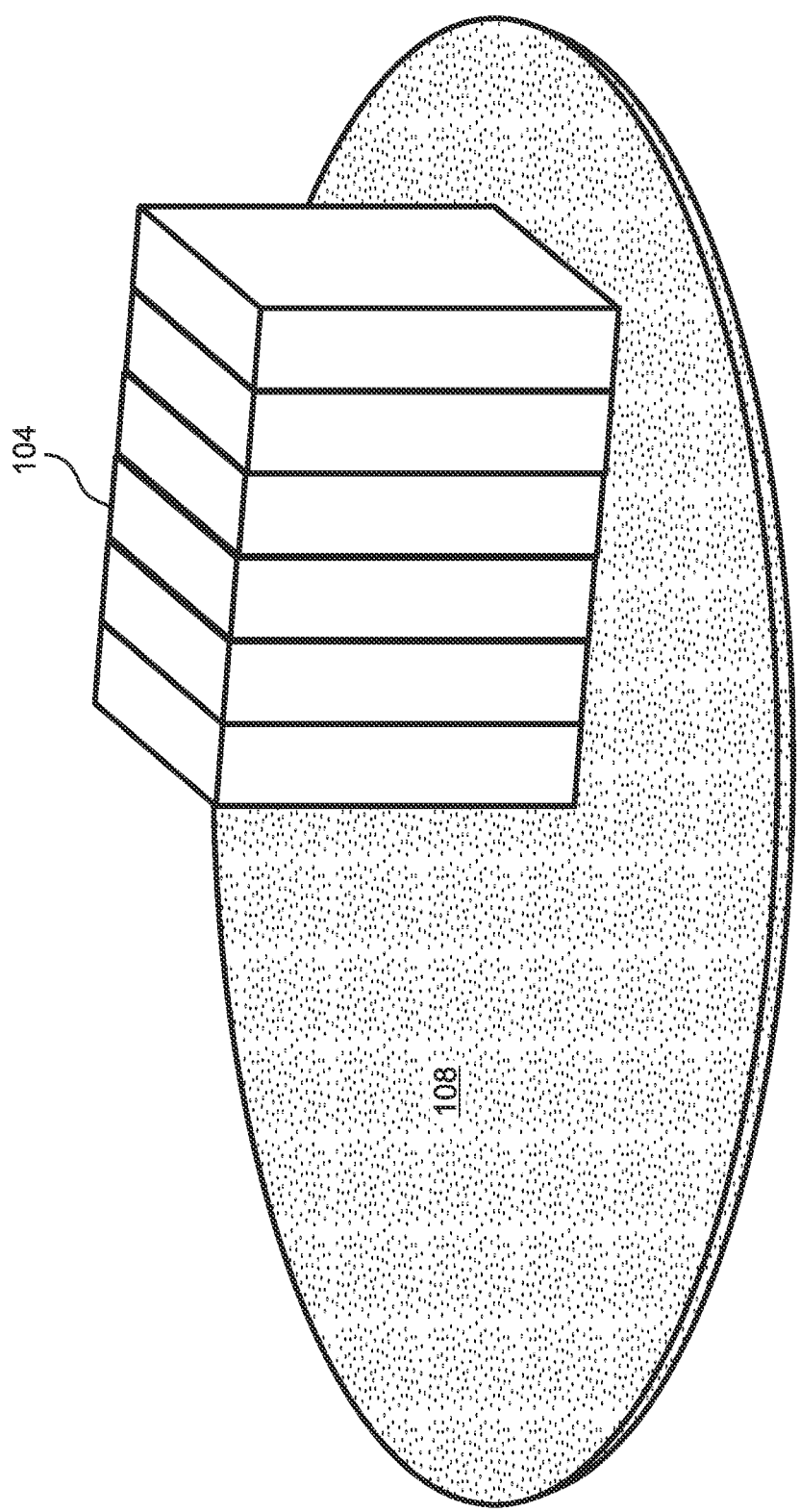
FIG. 1C illustrates the stack of tiles of FIG. 1B being ground to have precisely flat and perpendicular edges.
Figure 1D:
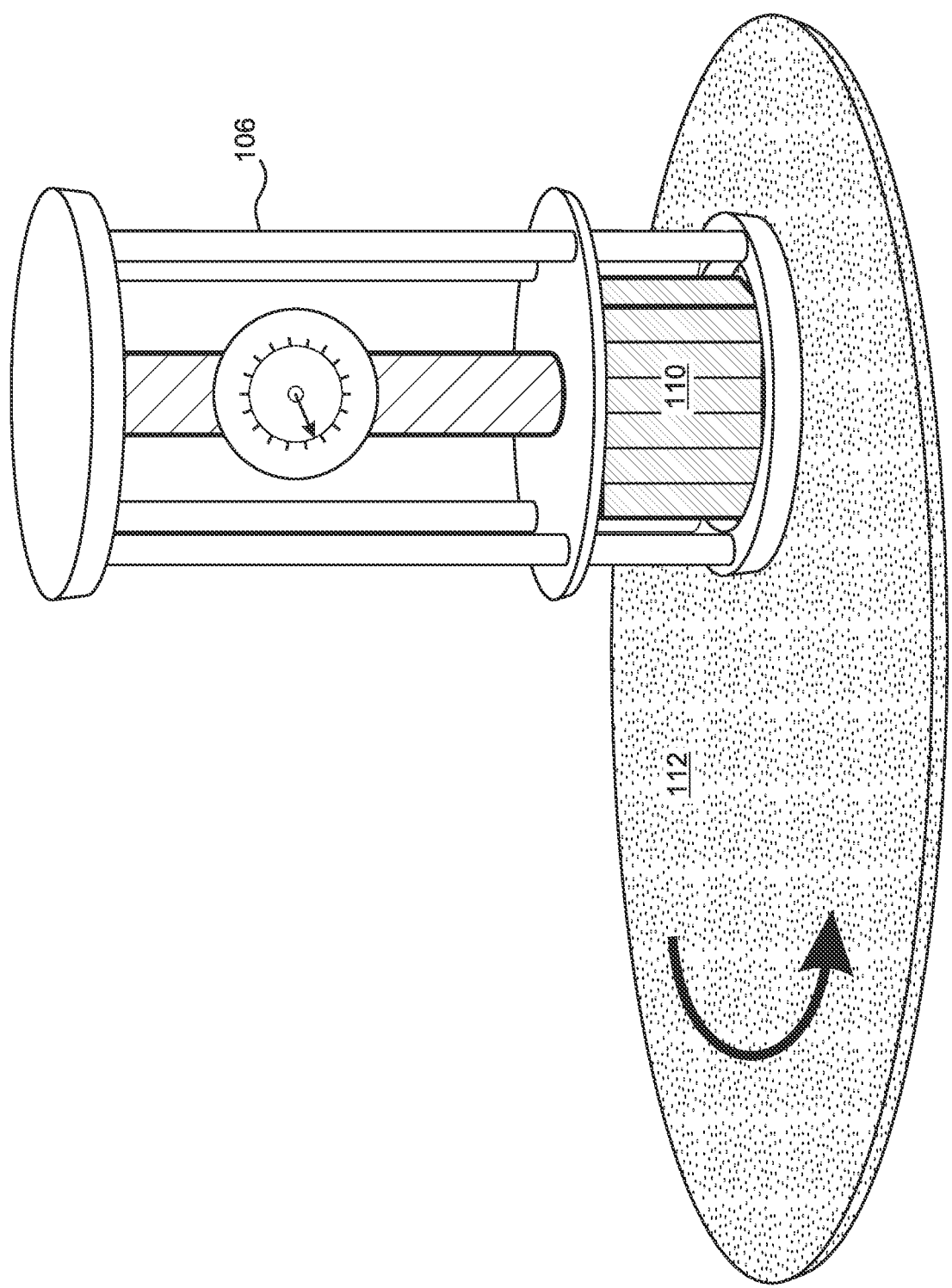
FIG. 1D illustrates the sides of the stack of tiles of FIG. 1C being polished to nanometer-scale roughness while maintaining a high degree of flatness.

With reference to FIG. 1C, in embodiments the rectangular slabs 104 are then beveled, stacked, and ground 108 such that they have precisely perpendicular edges. With reference to FIG. 1D, the stack is then mounted on a precision jig 106 and transformed into "precursor" slabs 110 by polishing 112 the surrounding, smaller sides of the rectangular slabs 104 to be ultra-flat and ultra-smooth. In embodiments, the sides of the precursor slabs 110 have a flatness of at least $\lambda/10$, and a roughness Ra of less than 10 nanometers.

Figure 1E:
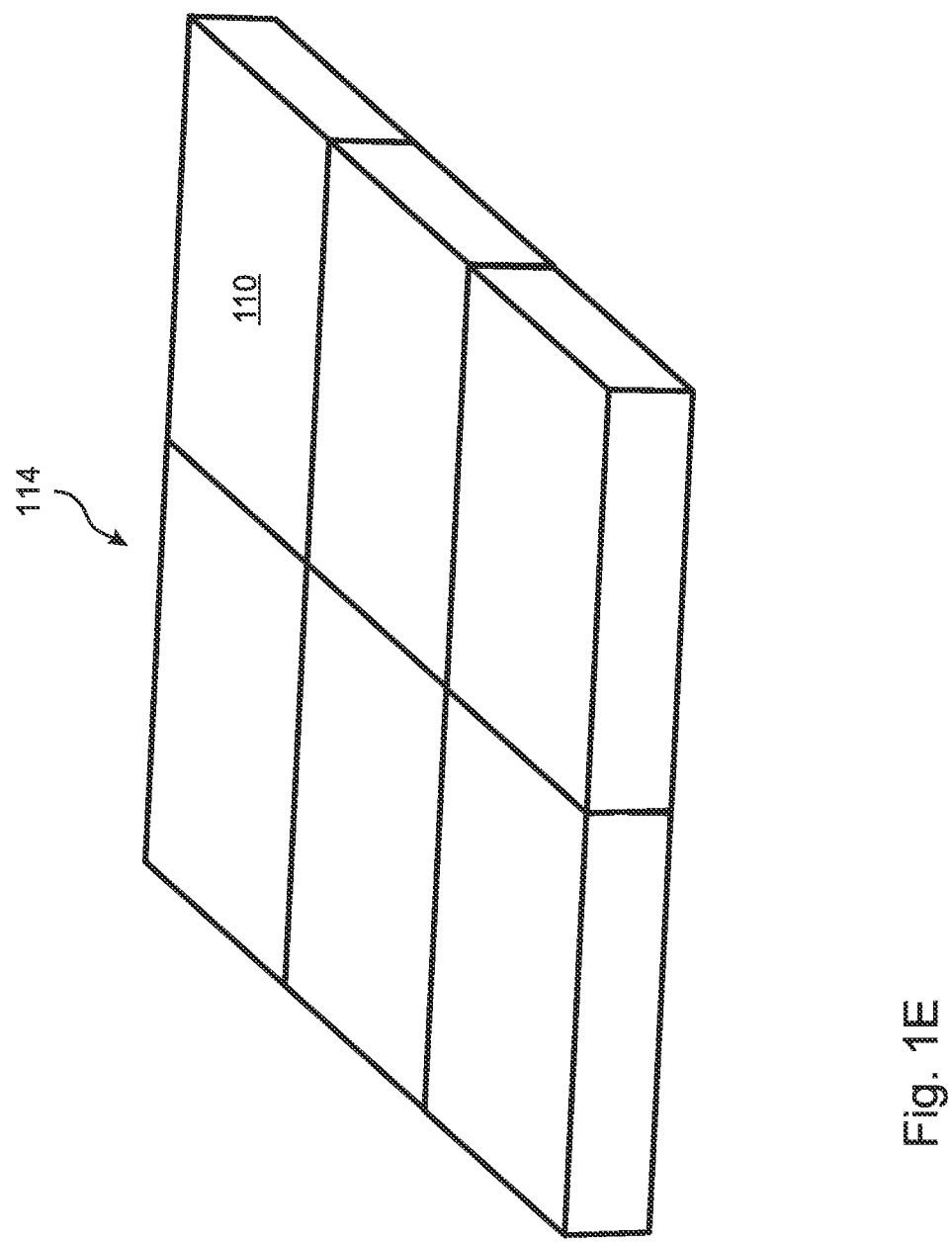
FIG. 1E illustrates the alignment and optical bonding together of a plurality of tiles to form a monolithic slab.
Figure 1F:
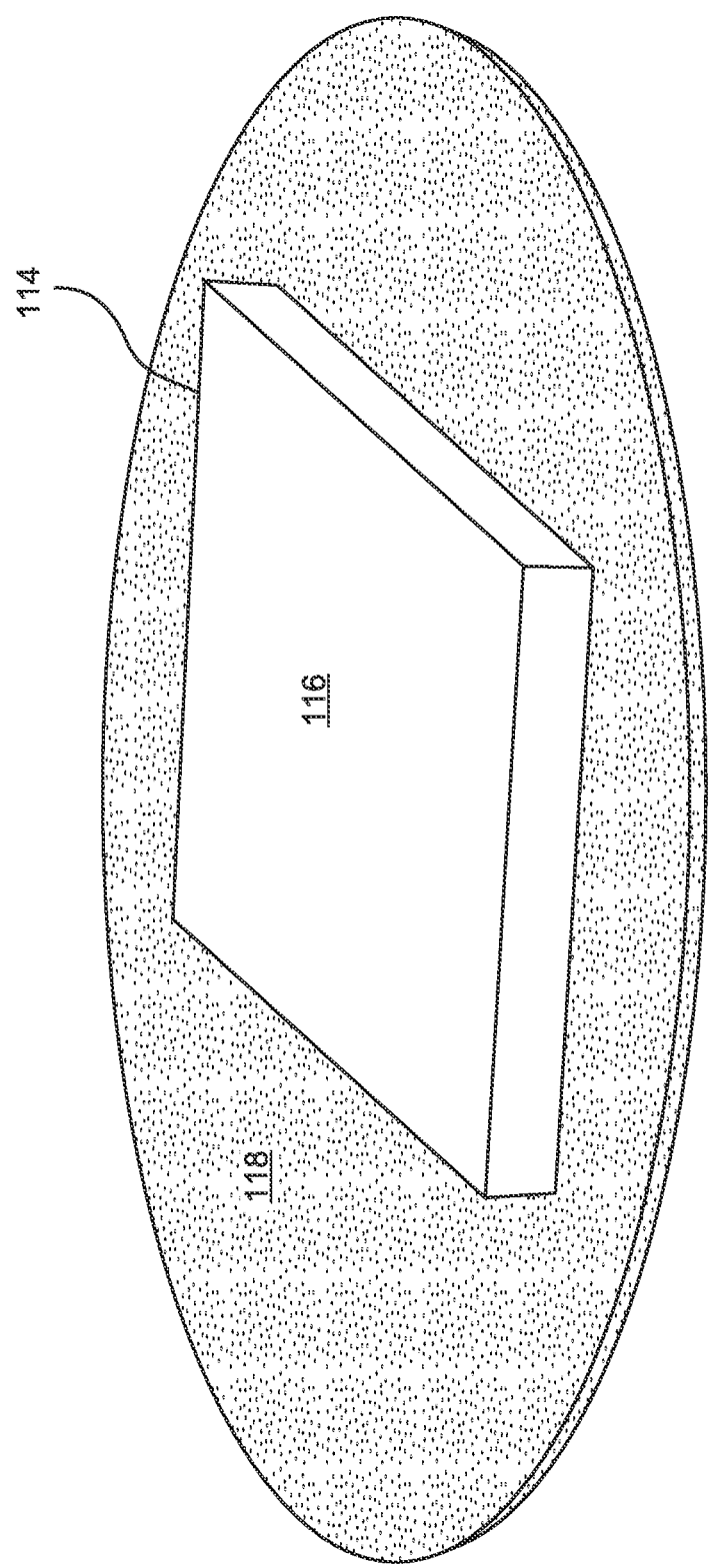
FIG. 1F illustrates the faces of the monolithic slab of FIG. 1E being ground to remove bevels and polished.

With reference to FIG. 1E, the smaller, surrounding sides of the precursor slabs 110 are then fused edge-to-edge via optical-contacting/bonding techniques to create a large GaAs or GaP window 114 having negligible bond interface losses. Finally, with reference to FIG. 1F, the faces 116 of the resulting GaAs or GaP window 114 are ground 118 to remove bevels, and polished.

With reference to FIG. 1G, in some embodiments EMI shielded GaAs or GaP windows 116 are produced by subsequently applying a conductive, doped GaAs or GaP layer to the window 116, for example by placing the window 116 in a vacuum deposition apparatus 120 and applying the conductive layer by MOCVD, or by another vacuum deposition method, followed, in embodiments, by deposition of electrical contacts and/or single or double-side anti-reflection (AR) coatings.

Figure 2:
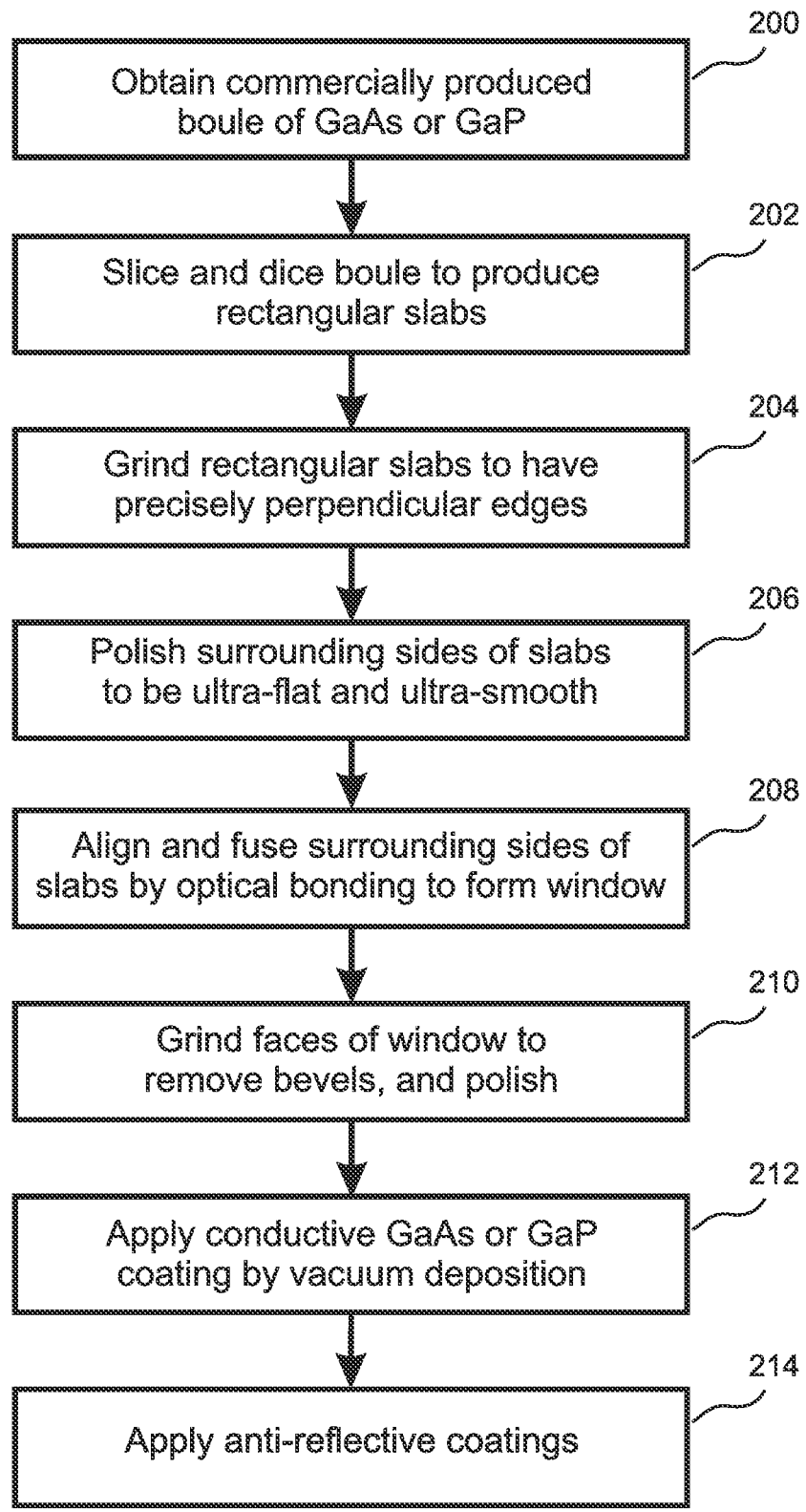
FIG. 2 is a flow diagram illustrating a method embodiment of the present disclosure.

FIG. 2 is a flow diagram that illustrates an embodiment of the presently disclosed method in which EMI shielded IR windows are produced. The method begins by obtaining 200 a commercially produced boule 100 of GaAs or GaP, which is then sliced and diced 202 to form a plurality of rectangular slabs 104. The rectangular slabs are then ground 204 so that they have ultra-perpendicular edges, and the smaller sides of the slabs 104 that surround the largest sides are polished 206 so that they are ultra-flat and ultra-smooth.

At this point, the rectangular slabs 104 are aligned and their smaller edges are brought together such that they are fused 208 by optical bonding to form a single, large window 116. The faces of the window 116 are then ground to remove bevels, and polished 210. Finally, a conductive layer of GaAs or GaP is applied 212 to at least one of the faces of the window 116, for example by vacuum deposition, after which anti-reflective coatings are applied 214.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. An infrared window comprising a GaAs slab having a slab largest dimension that is greater than eight inches, or a GaP slab having a slab largest dimension that is greater than four inches, said slab being formed by grinding and polishing surrounding sides of a plurality of rectangular parallelepiped slabs, referred to herein as rectangular slabs, and then aligning and contacting the surrounding sides of the rectangular slabs so as to optically bond the rectangular slabs to each other, thereby forming a GaAs monolithic window slab having a largest dimension that is greater than eight inches or a GaP monolithic window slab having a largest dimension that is greater than four inches.

2. The infrared window of claim 1, wherein the monolithic window slab has a largest dimension that is greater than 12 inches.

3. The infrared window of claim 1, wherein the surrounding sides of each of the rectangular slabs surround largest faces of the rectangular slabs.

4. The infrared window of claim 1, wherein all of the rectangular slabs have a common size and shape.

5. The infrared window of claim 1, further comprising a conductive layer of doped GaAs or GaP applied to at least one face of the monolithic window slab.

6. The infrared window of claim 1, further comprising an anti-reflective coating applied to at least one face of the monolithic slab.

7. A method of making a GaAs slab having a largest dimension that is greater than eight inches or a GaP slab having a largest dimension that is greater than four inches, the slab being suitable for forming an infrared (IR) transparent window having a largest dimension that is greater than eight inches, the method comprising:
  obtaining a boule of GaAs or GaP;
  slicing the boule to form a plurality of rectangular parallelepiped slabs, referred to herein as rectangular slabs;
  grinding the rectangular slabs to have precisely perpendicular edges;
  polishing surrounding sides of each of the rectangular slabs to a high degree of flatness and smoothness; and
  aligning the surrounding sides of the rectangular slabs with each other and contacting the surrounding sides together so as to optically bond the rectangular slabs to each other, thereby forming a GaAs monolithic window slab having a largest dimension that is greater than eight inches, or a GaP monolithic window slab having a largest dimension that is greater than four inches.

8. The method of claim 7, wherein obtaining the boule includes obtaining the boule from a commercial source.

9. The method of claim 7, wherein polishing surrounding sides of each of the rectangular slabs to a high degree of flatness and smoothness includes polishing the surrounding sides to a flatness of better than $\lambda/10$ and to a smoothness with Ra less than 10 nanometers.

10. The method of claim 7, further comprising grinding faces of the monolithic window slab to remove bevels.

11. The method of claim 7, further comprising polishing faces of the monolithic window slab.

12. The method of claim 7, wherein the monolithic window slab has a largest dimension that is greater than 12 inches.

13. The method of claim 7, wherein the surrounding sides of each of the rectangular slabs surround largest faces of the rectangular slabs.

14. The method of claim 7, wherein all of the rectangular slabs have a common size and shape.

15. The method of claim 14, wherein grinding the rectangular slabs to have precisely perpendicular edges includes arranging the rectangular slabs in a stacked configuration, and grinding sides of the stack.

16. The method of claim 14, wherein polishing surrounding sides of each of the rectangular slabs to a high degree of flatness and smoothness includes arranging the rectangular slabs in a stacked configuration, and polishing sides of the stack.

17. The method of claim 16, wherein the sides of the stack are polished while the stack is mounted on a precision jig.

18. The method of claim 7, further comprising applying a conductive layer of doped GaAs or GaP to at least one face of the monolithic window slab.

19. The method of claim 18, wherein the conductive layer is applied using a vacuum deposition process.

20. The method of claim 7, further comprising applying an anti-reflective coating to at least one face of the monolithic slab.

* * * * *